United States Patent [19]

Champlin

[11] Patent Number: 4,912,416
[45] Date of Patent: Mar. 27, 1990

[54] ELECTRONIC BATTERY TESTING DEVICE WITH STATE-OF-CHARGE COMPENSATION

[76] Inventor: Keith S. Champlin, 5437 Elliot Ave. S., Minneapolis, Minn. 55417

[21] Appl. No.: 367,303

[22] Filed: Jun. 16, 1989

Related U.S. Application Data

[62] Division of Ser. No. 202,883, Jun. 6, 1988, abandoned.

[51] Int. Cl.$^4$ .................... G01N 27/04; G01N 27/00
[52] U.S. Cl. .................................... 324/430; 324/429; 324/426; 320/48
[58] Field of Search ............... 324/426, 430, 433, 431, 324/436; 340/636; 320/48

[56] References Cited

U.S. PATENT DOCUMENTS

| | | | |
|---|---|---|---|
| 3,873,911 | 3/1975 | Champlin | 324/430 |
| 3,909,708 | 9/1975 | Champlin | 324/431 |
| 4,816,768 | 3/1989 | Champlin | 324/428 |
| 4,825,170 | 4/1989 | Champlin | 324/436 |

Primary Examiner—Reinhard J. Eisenzopf
Assistant Examiner—Jack B. Harvey
Attorney, Agent, or Firm—Dorsey & Whitney

[57] ABSTRACT

A self-contained electronic device for testing storage batteries that may be partially discharged is disclosed. The testing device performs small-signal measurements of the battery's dynamic conductance and provides either a proportional numerical readout, displayed in appropriate battery measuring units, or a corresponding qualitative assessment of the battery's relative conduction based upon its electrical rating. In addition, the testing device measures the battery's open-circuit (unloaded) voltage and provides adjustable means for correcting the dynamic conductance test result in inverse correspondence with the battery's open-circuit voltage relative to its fully-charged value. By virtue of this correction, the quantitative or qualitative information displayed to the user in the dynamic conductance test is adjusted to comport with that of a fully-charged battery even through the battery may, in actual fact, be only partially charged when tested.

10 Claims, 4 Drawing Sheets 4,912,416

ELECTRONIC BATTERY TESTING DEVICE WITH STATE-OF-CHARGE COMPENSATION

This is a division of application Ser. No. 202,883, filed June 6, 1988 now abandoned.

TECHNICAL FIELD

This invention relates to an electronic measuring device for assessing the ability of a storage battery or other dc source of electricity to deliver power to a load. More specifically, it relates to improved measuring apparatus of the type disclosed in copending U.S. patent application Ser. No. 169,858 filed on Mar. 18, 1988 by Keith S. Champlin, copending U.S. patent application "Electronic Battery Testing Device with Automatic Voltage Scaling" filed on May 25, 1988 by Keith S. Champlin, and to U.S. Pat. Nos. 3,873,911 and 3,909,708, issued to Keith S. Champlin on Mar. 25, 1975, and on Sept. 30, 1975, respectively.

BACKGROUND ART

Storage batteries are employed in many applications requiring electrical energy to be retained for later use. Most commonly, they are employed in motor vehicles utilizing internal combustion engines. In such applications, energy is stored by "charging" the battery during engine operation and is later used to power lights, radio, and other electrical apparatus when the engine is stopped. The most severe demand upon the battery of a motor vehicle is generally made by the starter motor. Failure to supply the starter motor with sufficient power to satisfactorily crank the engine, particularly in cold weather, is usually the first indication of battery deterioration. Clearly, a simple measurement that accurately assesses a battery's ability to supply power to a heavy load is of considerable value.

Prior to the publication of U.S. Pat. Nos. 3,873,911 and 3,909,708, the only method generally available for assessing a battery's ability to supply load power was the standard load test. A standard load test subjects a battery to a heavy dc load current having a predetermined value dictated by the battery's rating. After a prescribed time interval, the battery's terminal voltage under load is observed. The battery is then considered to have "passed" or "failed" the load test according to whether its terminal voltage is greater then, or less than, a particular value.

Although the standard load test has been widely used for many years to field-test storage batteries, it possesses several serious disadvantages. These disadvantages include:

1. A standard load test draws very large currents and therefore requires apparatus that is heavy and cumbersome.

2. Because of these large currents, considerable "sparking" will occur at the battery terminals if the test apparatus is connected or disconnected under load conditions. Such "sparking" in the presence of battery gasses can cause an explosion with potentially serious injury to the operator.

3. A standard load test leaves the battery in a significantly reduced state of charge and therefore less capable of cranking the engine than before the test was performed.

4. The battery's terminal voltage drops with time during performance of a load test. Accordingly, load test results are generally imprecise and greatly dependent upon the skill of the operator.

5. Load test results are not repeatable since the test itself temporarily polarizes the battery. Such test-induced polarization significantly alters the initial conditions of any other load tests performed subsequently.

A practical alternative to the standard load test is taught in U.S. Pat. Nos. 3,873,911 and 3,909,708. These documents disclose electronic apparatus for accurately assessing a battery's condition by means of small-signal ac measurements of its dynamic conductance. They teach that a battery's dynamic conductance is directly proportional to its load test current; or to its dynamic power—the maximum power that the battery can deliver to a load. Dynamic conductance is therefore a direct measure of a battery's electrical condition.

Two electronic battery tester embodiments are disclosed in U.S. Pat. No. 3,873,911; each of which accurately determines a battery's dynamic conductance and provides the operator with a numerical reading in battery measuring units that are directly proportional to this quantity. The first embodiment comprises a bridge circuit that is brought to balance by the operator to obtain the numerical reading. The preferred second embodiment provides the operator with a direct readout that may be displayed numerically on a digital or analog meter. The operating principles of the preferred, direct-reading, second embodiment of the invention taught in U.S. Pat. No. 3,873,911 are based upon the theory of high-gain feedback amplifiers.

U.S. Pat. No. 3,909,708 likewise discloses two electronic battery tester embodiments. However, from the operator's point of view, their operation more closely resembles the operation of a traditional load-test apparatus than does operation of either of the numerical-reading embodiments disclosed in U.S. Pat. No. 3,873,911. Rather than obtaining a numerical measurement, the operator manually sets a selector knob on the panel of the apparatus to the electrical rating of the battery undergoing test. The disclosed apparatus then employs small-signal measurements of dynamic conductance to simply ascertain whether or not the battery is capable of delivering an amount of power appropriate to the selected rating. Accordingly, the two embodiments disclosed in U.S. Pat. No. 3,909,708 provide qualitative "pass-fail" battery condition information, just as does a conventional load test apparatus. However, they accomplish this result without drawing significant current from the battery and are therefore not subject to the serious disadvantages of a load test. Just as with the second embodiment disclosed in the earlier patent, the operating principles of the second, preferred, embodiment disclosed in U.S. Pat. No. 3,909,708 are based upon the theory of high-gain feedback amplifiers.

The improved electronic battery testing device disclosed in U.S. patent application Ser. No. 169,858 uses advanced MSI integrated circuitry and incorporated the functions of both of the two earlier-disclosed feedback-type electronic battery testing devices in a single embodiment. By using all fixed resistances and calibrating the output display in appropriate battery measuring units, the disclosed device emulated a direct reading battery tester. In addition, by letting one resistance be variable, calibrating it in appropriate battery rating units, and arranging the output display to denote qualitative conditions, the "pass-fail" type of dynamic conductance battery tester is emulated. A two-position switch is employed to select either a fixed resistance or a variable resistance and hence to select the emulation of either the direct-reading battery testing device of the "pass-fail" type of battery testing device.

The improved electronic battery testing device discloses in U.S. patent application "Electronic Battery Testing Device with Automatic Voltage Scaling" filed on May 25, 1988 additionally includes special voltage-sensing circuitry which identifies the nominal voltage of the battery being tested and automatically scales the readout information to comport with the battery's nominal voltage.

In comparison with the load test method of battery appraisal, the dynamic conductance testing method has many advantages. For example, dynamic conductance testing utilizes electronic apparatus that is small and lightweight, draws very little current, produces virtually no sparking when connected or disconnected, does not significantly discharge or polarize the battery, and yields very accurate, highly reproducible, test results. Virtually millions of battery measurements performed over the course of thirteen years have fully corroborated these teachings and have proven the validity of this alternative testing method.

SUMMARY OF THE INVENTION

A battery's dynamic conductance directly reflects its size and electrical condition. In addition to its size and condition however, a particular battery's dynamic conductance is also significantly affected by its current state-of-charge. Heretofore, this state-of-charge dependence has required the battery to be essentially fully charged in order that its dynamic conductance tests provide accurate or meaningful results. Since many batteries are, in fact, partially discharged when they are returned for replacement under warranty, or when they are otherwise suspected of being faulty, it has been frequently necessary to recharge a battery before testing it. Such recharging is a costly and time-consuming procedure. Clearly, a simple method for performing accurate dynamic conductance tests of batteries "as is"—batteries that may be only partially charged—would be of considerable benefit.

As is well known to those skilled in the art, a battery's state-of-charge is directly related to it open-circuit (unloaded) terminal voltage. For example, with automotive-type lead-acid batteries having nominal voltages of 12 volts, the open-circuit voltage is known to vary from about 11.2 volts to about 12.6 volts over the range of battery charge extending from almost total discharge to nearly full charge.

I have analyzed the results of numerous measurements of dynamic conductance and open-circuit voltage performed on automotive-type lead-acid batteries in various conditions of partial discharge. On the basis of this analysis, I have discovered a strong empirical correlation between a battery's state-of-charge, as reflected by its open-circuit voltage, and its relative dynamic conductance, normalized with respect to its full-charged value. Through the use of this empirical relationship, I have established practical means for employing open-circuit voltage measurements to correct the quantitative or qualitative results of dynamic conductance battery tests. The resulting corrected test results are found to be relatively independent of the battery's state-of-charge. My invention, which is fully disclosed herein below, therefore solves the very important technical problem of testing batteries in "as is" condition; batteries that may frequently be only partially charged.

A self-contained electronics device for testing storage batteries that may be partially discharged is disclosed below. The testing device performs small-signal measurements of the battery's dynamic conductance and provides either a proportional numerical readout, displayed in appropriate battery measuring units, or a corresponding qualitative assessment of the battery's relative condition based upon its electrical rating. In addition, the testing device measures the battery's open-circuit (unloaded) voltage and provides adjustable means for correcting the dynamic conductance test result in inverse correspondence with the battery's open-circuit voltage relative to its fully-charged value. By virtue of this correction, the quantitative or qualitative information displayed to the user in the dynamic conductance test is adjusted to comport with that of a fully-charged battery even though the battery may, in actual fact, be only partially charged when tested.

The electronic battery testing device with state-of-charge compensation hereof can be used to obtain a qualitative or quantitative assessment of a wide variety of electrochemical energy sources other than lead-acid batteries. For example, single electrochemical cells can be tested in a manner identical to that applied to testing batteries of series-connected cells. Furthermore, by utilizing appropriate correction factors, the invention can be used to test other electrochemical energy sources such as nickel-cadmium cells and batteries or lithium cells and batteries. The invention hereof is widely applicable to such testing by virtue of its simplicity, its safety, its accuracy, its ease of operation, and its low cost.

As has been fully disclosed in the two issued U.S. Patents referred to above, a conventional battery test of a fully-charged battery traditionally ignores the open-circuit voltage, $V_o$. Instead, the electronic test apparatus directly measures the battery's dynamic conductance $G_x = 1/R_x$. The testing device then provides the operator with either a direct numerical readout displayed in proportional battery measuring units (such as "Cold Cranking Amps", "Ampere-Hours", or "Watts"), or else with a qualitative display ("Pass/Fail") based upon comparing the measured value $G_x$ with a corresponding reference value determined from the battery's electrical rating and temperature.

Although the open-circuit voltage, $V_o$, has not been normally used in dynamic conductance testing of fully-charged batteries, it has been frequently used to determine state-of-charge. As is well known to those skilled in the art, battery's state-of-charge is directly related to is open-circuit (unloaded) terminal voltage. For example, with automotive-type lead-acid batteries having nominal voltages of 12 volts, the open-circuit voltage is known to vary from about 11.2 volts, for batteries that are virtually totally discharged, to about 12.6 volts, for batteries that are nearly fully charged.

I have analyzed the results of numerous measurements of dynamic conductance and open-circuit voltage performed on automotive-type lead-acid batteries in various conditions of partial discharge. On the basis of this analysis, I have discovered a strong empirical correlation between a battery's state-of-charge, as reflected by its open-circuit voltage, and its relative dynamic conductance, normalized with respect to is fully-charged value.

Figure 1:
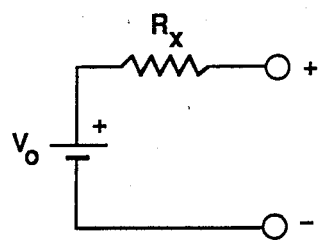
FIG. 1 depicts the Thevenin's equivalent circuit of a lead-acid storage battery comprising its series-connected open-circuit voltage, $V_o$, and its internal resistance, $R_x$.
Figure 2:
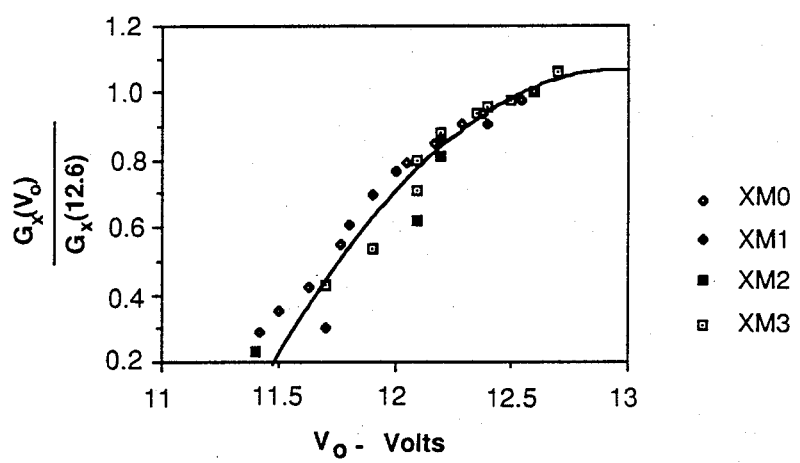
FIG. 2 is an empirical plot of normalized dynamic conductance, $G_x$, versus open-circuit voltage, $V_o$, showing the correlation with measurements performed upon four different lead-acid storage batteries having differing electrical ratings and fabricated by different manufacturers.

FIG. 2 discloses the observed empirical relation between normalized dynamic conductance and open-circuit voltage for a large class of automotive-type lead-acid storage batteries. This figure displays a graph of relative dynamic conductance, normalized with respect to the fully-charged value, $G_x(V_o)/G_x(12.6)$, plotted as a function of open-circuit voltage, $V_o$. The solid curve plotted in FIG. 2 is described by a second-order polynomial equation having coefficients adjusted to best fit the experimental data. The appropriately adjusted polynomial equation is $$\frac{G_x(V_o)}{G_x(12.6)} = -\{78.1963\} + \{12.3939\}V_o - \{0.4848\}V_o^2 \quad (1)$$

FIG. 2 also discloses normalized experimental points which represent actual measurements obtained from four different batteries possessing different electrical ratings and fabricated by different manufacturers. Batteries XM0, XM1, and XM3 are six-cell batteries having nominal voltages of 12 volts. Battery XM2 is actually a three-cell, 6-volt battery. Open-circuit voltage measurements of battery XM2 were multiplied by a factor of two in order to plot XM2 data points in FIG. 2. One sees that the normalized measurements obtained from all four batteries agree quite closely with the empirical relation described by Equation (1). The fact that the same empirical relation shows strong correlation with experimental data obtained from both 6-volt and 12-volt batteries indicates that the empirical state-of-charge correction disclosed in FIG. 2 is quite universal and is actually a fundamental property of a single cell.

Figure 3:
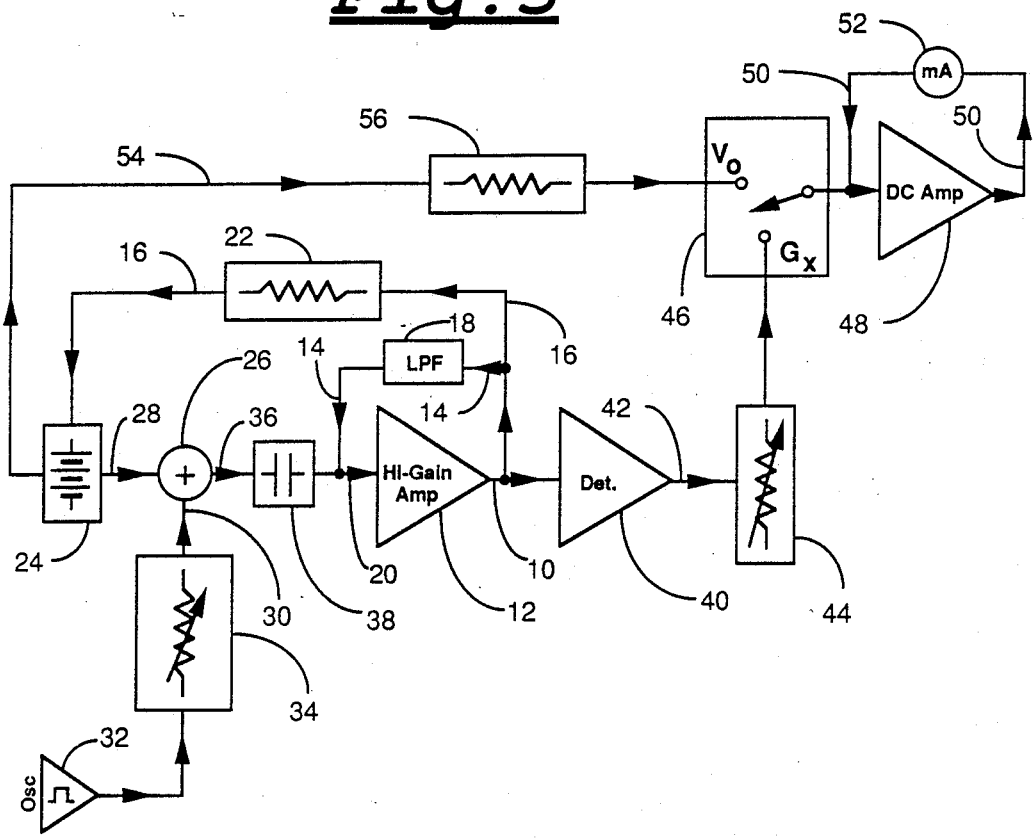
FIG. 3 is a simplified block diagram of an improved electronic battery testing device employing state-of-charge compensation in accordance with the present invention.

Referring now to FIG. 3, a simplified block diagram of an improved electronic battery testing device with state-of-charge compensation is disclosed. Signals representative of the signal at output 10 of high-gain amplifier cascade 12 are fed back to input 20 of high-gain amplifier cascade 12 by means of two feedback paths; internal feedback path 14 and external feedback path 16. Internal feedback path 14 includes low pass filter (LPF) 18 and feeds a signal directly back to input 20 of high-gain amplifier cascade 12. The purpose of internal feedback path 14 and low pass filter 18 is to provide large dc feedback but very little ac feedback in order to fix the operating point of high-gain amplifier cascade 12 and insure its dc stability without appreciably reducing its ac voltage gain. External feedback path 16 contains resistive network 22 and feeds a signal back to the battery undergoing test 24. Summation circuitry 26 combines the resulting signal voltage 28 developed thereby across battery 24 with a 100 Hz periodic square-wave signal voltage 30 provided by oscillator 32 through variable attenuator network 34 providing adjustable state-of-charge compensation. The resulting composite signal 36 is capacitively coupled to input 20 of high-gain amplifier cascade 12 by means of capacitive coupling network 38.

As has been fully explained in copending U.S. patent application Ser. No. 169,858, the voltage at output 10 of high-gain amplifier cascade 12 comprises a constant dc bias component along with an ac signal component that is proportional to the dynamic conductance of the battery undergoing test 24. The constant dc bias component is ignored while the ac signal component is detected and accurately converted to a dc signal by detector 40.

The dc signal at output 42 of detector 40 is passed through adjustable resistive network 44 to the $G_x$ input of function selector switch 46. Function selector switch 46 changes the function of the improved electronic battery testing device between measuring dynamic conductance, $G_x$, and measuring open-circuit voltage, $V_o$.

With function selector switch 46 in the $G_x$ position, the signal at the output of resistive network 44 is applied to the input of dc-coupled operational amplifier 48. Feedback path 50 of operational amplifier 48 contains dc milliameter 52. Accordingly, the reading dc milliameter 52 is proportional to the dc signal level at the output 42 of detector 40, and hence to the dynamic conductance of battery 24; while the constant of proportionality relating the reading to $G_x$ is controlled by the values assumed by adjustable resistive network 44 and variable attenuator network 34.

With function selector switch 46 in the $V_o$ position, the input of operational amplifier 48 senses the terminal voltage of battery 24 through voltage-sensing conductor 54 and voltage-calibration resistor 56. Since feedback path 50 of operational amplifier 48 contains dc milliameter 52, the current through dc milliameter 52 is now proportional to the terminal voltage of battery 24. By virtue of the fact that the electronic apparatus disclosed in FIG. 3 draws very little load current from the battery, this measured voltage is essentially the battery's open-circuit terminal voltage, $V_o$.

Although the above described voltage-measuring function is implemented with an operational amplifier in the embodiment disclosed in FIG. 3, it will be apparent to those skilled in the art that many other means for determining the value of the open-circuit voltage are possible. The actual means utilized is considered to be simply a matter of choice, and all such choices are intended to be included within the scope of the instant invention.

Assume now that function selector switch 46 is in the $G_x$ position. By utilizing an appropriate fixed resistance value in resistive network 44 and then calibrating milliameter 52 in battery measuring unit numbers that are proportional to the battery's dynamic conductance, the embodiment disclosed in FIG. 3 will emulate the direct reading battery tester disclosed in U.S. Pat. No. 3,873,911. In addition, as is fully taught in U.S. patent application Ser. No. 169,858, the resistance value of resistive network 44 which brings the reading of dc milliameter 52 to a particular fixed value is directly proportional to the dynamic conductance of battery 24. Hence, by calibrating resistive network 44 in traditional battery rating units, and then designating "pass" and "fail" regions on the face of milliameter 52, the embodiment disclosed in FIG. 3 will also emulate the "pass-fail" battery testing device disclosed in U.S. Pat. No. 3,909,708. Furthermore, one can employ a switch to select either a fixed-value resistive network 44 or an adjustable-valued network 44 and can arrange both a number scale and "pass-fail" regions on the face of milliameter 52. One can therefore realize both a direct-reading battery tester and a "pass-fail" battery tester with a single device.

For either emulation, the level of the detected signal at the output 42 of detector 40 is directly proportional to the level of the square-wave signal 30 at the output of variable attenuator network 34. Hence, with function selector switch 46 in the $G_x$ position, both the level of the numerical quantity displayed in direct-reading operation as well as the relative qualitative assessment provided in "pass-fail" operation will be determined by the amount of attenuation introduced by variable attenuator 34.

In the embodiment hereof, variable attenuator 34 is used to implement the state-of-charge correction described by the empirical relation disclosed in FIG. 2. Accordingly, variable attenuator network 34 is arranged to adjust the detected signal level in inverse correspondence with the value of the open-circuit voltage relative to its fully-charged value. That is, if $V_o$ is less than 12.6 volts, the attenuation is appropriately reduced and the detected signal level is correspondingly increased. With this particular embodiment, the value of the open-circuit voltage used in the correction is manually entered into the device by the user. The appropriate value is first determined by selecting the "$V_0$" position of function selector switch 46 and measuring the battery's open-circuit voltage. After thus determining $V_o$ and entering its value by adjusting variable attenuator network 34 accordingly, the user selects the "$G_x$" position of function selector switch 46 and dynamically tests the battery in the normal way. The corrected battery test result will then comport with that of a fully-charged battery.

Variable attenuator network 34 may comprise one of several different possible embodiments. It man, for example, comprise a continuously variable attenuator having an associated numerical scale calibrated in units of open-circuit voltage, $V_o$. Alternatively, variable attenuator network 34 may comprise a multi-position switch capable of selecting one of a plurality of discrete attenuation values—with each position of the switch associated with a particular range of open-circuit voltage, $V_o$. In either case, the relationship between the open-circuit voltage entered by the user and the corresponding attenuation value introduced by variable attenuator network 34 is provided by the empirical relation disclosed in FIG. 2. Accordingly, the detected output signal level will be adjusted in inverse correspondence with the value of the battery's open-circuit voltage relative to 12.6 volts. That is, if $V_o$ is less than 12.6 volts, the signal level will be correspondingly increased by reducing the attenuation of variable attenuator network 34. Variable attenuator network 34, used to implement the state-of-charge correction in the embodiment disclosed in FIG. 3, is placed immediately following oscillator 32. It should be understood, however, that this placement is intended to be illustrative only. Such variable attenuator means could actually be inserted at many points in the signal-flow chain between the oscillator means and the output display means to accomplish this same result. For example, the functions of variable attenuator network 34 and adjustable resistive network 44 could actually be interchanged so that the open-circuit voltage would be entered with network 44 and the battery rating entered with variable attenuator network 34. Many other alternative placements of variable attenuator means for entering $V_o$ will be obvious to those skilled in the art, and all such placements are intended to be within the scope of the present invention.

The battery tester embodiment disclosed in FIG. 3 utilizes a dc milliameter to display the results of the tests. However, one should be aware of the fact that this particular display implementation represents only one of many possible display implementation means. For example, the numerical result required for both the direct-reading dynamic conductance battery test and the open-circuit voltage measurement could be displayed with a digital meter, or with a numeric printout, or with a screen display on a computer terminal. Similarly, the qualitative result required of a "pass-fail" type of dynamic conductance battery test could be displayed with a plurality of colored lights of LEDs or with an audible signal. Those, and other choices would be obvious to one skilled in the art and are intended to be included within the scope of the present invention.

Figure 4A:
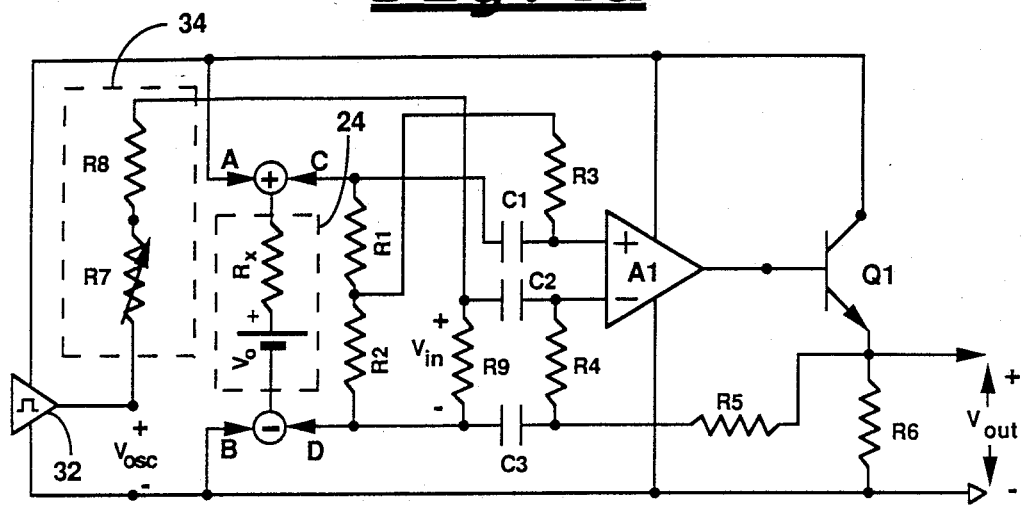
FIG. 4a and 4b are simplified schematic diagrams of a part of the block diagram of FIG. 3 illustrating two possible implementations of the variable attenuator network providing state-of-charge compensation.
Figure 4B:
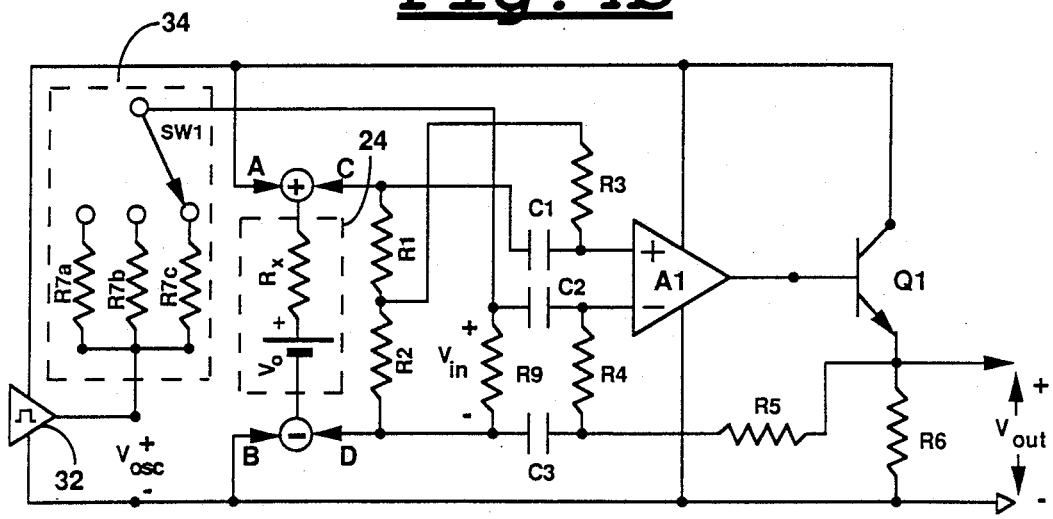

Referring next to FIGS. 4a and 4b, two simplified schematic diagrams of a part of the block diagram of FIG. 3 are disclosed. In each figure, operational amplifier A1 along with its dc biasing resistors R1, R2, and R3, and transistor Q1 connected as an emitter follower, comprise high-gain amplifier cascade 12 of FIG. 3. In addition, resistors R4 and R5 along with capacitor C3 comprise low pass filter 18; resistor R6 comprises resistive network 22; and capacitors C1 and C2 comprise capacitive coupling network 38. The voltage at output 10 of amplifier 12, which is presented to the input of detector 40, is represented by $V_{out}$ developed across resistor R6 in FIGS. 4a and 4b.

Battery 24 is represented in FIGS. 4a and 4b by its Thevenin's equivalent circuit comprising its open-circuit emf $V_o$ in series with its internal resistance $R_x$. The periodic square-wave signal at the output of oscillator 32 is represented by voltage $V_{osc}$ in FIGS. 4a and 4b. The signal presented to summation circuitry 26 by oscillator 32 at output 30 of variable attenuator 34 is represented by voltage $V_{in}$. Summation circuitry 26 comprises the series interconnection of voltage $V_{in}$ and the voltage developed across battery 24 is sensed by the two connections C and D contacting battery 24. External feedback path 16 comprises the conductors leading from transistor Q1 and resistor R6 to the connections A and B contacting battery 24.

The two invention embodiments disclosed in FIGS. 4a and 4b differ in the manner in which they implement the selectable state-of-charge compensation provided by variable attenuator network 34. The embodiment disclosed in FIG. 4a provides a continuously variable attenuation value selected by means of the setting of variable resistor R7. The embodiment disclosed in FIG.

4b provides either of three discrete values selected by means of the setting of three-position switch SW1. Both embodiments vary the attenuation by varying the value of the "injection" resistor connecting the output of oscillator 32 with the "viewing" resistor R9. As stated above however, many other means for achieving variable attenuation are possible; and the two implementations disclosed in FIGS. 4a and 4b are intended to be illustrative only.

Referring now to FIG. 4a, calibration of the continuously variable attenuator network 34 will be described. Under the (easily-justified) assumption that R9<<(R7+R8), the ratio of $V_{in}$ to $V_{osc}$ can be written $$\frac{V_{in}}{V_{osc}} = \frac{R9}{R7 + R8}. \quad (2)$$

The attenuation of the resistive network, which is the reciprocal of this value, is therefore $$\frac{V_{osc}}{V_{in}} = \frac{R7 + R8}{R9}. \quad (3)$$

In order to implement state-of-charge compensation, the signal level $V_{in}$ should be adjusted in inverse correspondence with the value of $V_o$ relative to its fully-charged value. Accordingly, the attenuation of the resistive network should be adjusted in proportion to the compensation correction factor disclosed in FIG. 2 and mathematically described by Equation (1). By combining Equations (1) and (3), one obtains $$\frac{R7 + R8}{R9} = K[-\{78.1963\} + \{12.3939\}V_o - \{0.4848\}V_o^2]. \quad (4)$$

where K is a constant factor containing the over-all amplifier gain.

The constant K can be eliminated by normalizing Equation (4) with respect to its value at $V_o$=12.6 while noting from FIG. 2 that the 12.6-volt correction factor equals unity. One is thus led to the following relation:

$$\frac{R7(V_o) + R8}{R7(12.6) + R8} = -\{78.1963\} + \{12.3939\}V_o - \{0.4848\}V_o^2. \quad (5)$$

Equation (5) describes a calibration equation relating the values of resistances R7 and R8 to the measured open-circuit voltage, $V_o$. By using Equation (5), one can readily determine the appropriate number scale to be associated with variable resistance R7 in order to implement state-of-charge compensation in accordance with the empirical relation of FIG. 2.

Analysis of the discrete attenuator circuit disclosed in FIG. 4b proceeds in a similar fashion. With the discrete attenuator, one of the switch positions will correspond to a correction factor of unity; that is to $V_o$=12.6. Assuming that this switch position selects resistor R7a, the other two resistors are then determined from the corresponding calibration equation $$\frac{R7x}{R7a} = -\{78.1963\} + \{12.3939\}V_{ox} - \{0.4848\}V_{ox}^2. \quad (6)$$

where x represents either b, or c; and $V_{ob}$ and $V_{oc}$ are the open-circuit voltages associated with resistances R7b, and R7c, respectively. The exact values of $V_{ob}$ and $V_{oc}$ used in calculating R7b and R7c from Equation (6) would normally be chosen to be in the exact centers of the respective open-circuit voltage ranges associated with the corresponding switch positions.

Figure 5:
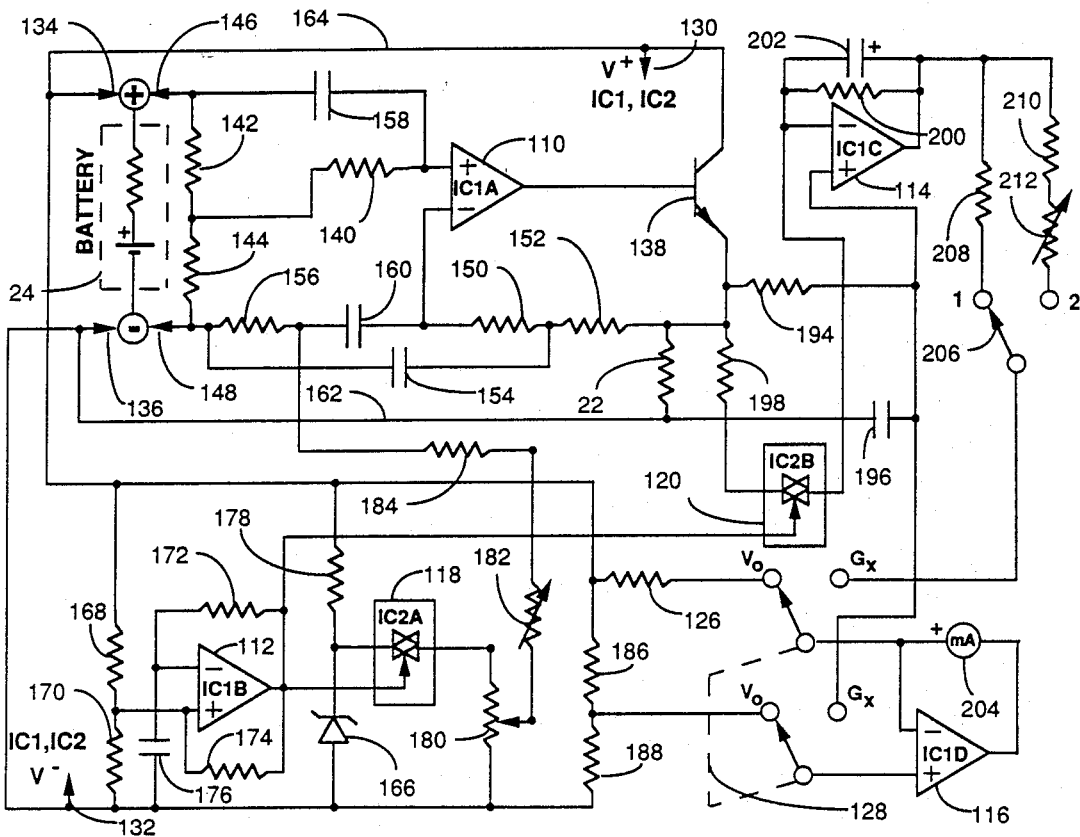
FIG. 5 is a complete schematic diagram of an improved electronic battery testing device with state-of-charge compensation configured for testing 12-volt automotive batteries in accordance with the present invention. DETAILED DESCRIPTION Referring first to FIG. 1, the Thevenin's equivalent circuit of a lead-acid storage battery is shown. In this equivalent representation, the battery is described by its open-circuit voltage, $V_o$, and its internal resistance, $R_x$, connected in series.

FIG. 5 discloses a complete schematic diagram of an improved electronic battery testing device with state-of-charge compensation configured for testing 12-volt batteries in accordance with the present invention. Operational amplifiers 110, 112, 114, and 116 comprise four elements of an MSI quad operational amplifier integrated circuit, IC1. Bilateral analog switches 118 and 120 comprise two elements of a quad CMOS bilateral switch integrated circuit IC2. Both integrated circuits, IC1 and IC2, are powered by means of common connections, 130 and 132, to the battery undergoing test 24 through battery contacts 134 and 136, respectively.

High-gain amplifier cascade 12 of FIG. 3 comprises operational amplifier 110 and npn transistor 138 connected as an emitter follower. Resistor 140 conducts a dc bias voltage to the noninverting (+) input of operational amplifier 110 from voltage divider resistors 142 and 144 which are connected to battery 24 through battery contacts 146 and 148. The output voltage of high-gain amplifier cascade 12 is established across external-path feedback resistor 12. An internal feedback path comprising resistors 150 and 152 conducts the dc voltage at the common connection between the emitter of npn transistor 138 and resistor 22 to the inverting (−) input of operational amplifier 110. Resistors 150 and 152 along with capacitor 154 comprise low-pass filter 18 of FIG. 3.

The ac signal voltage developed across battery 24 is sensed at battery contacts 146 and 148 and added in series to an input signal voltage component established across viewing resistor 156. The resultant composite ac signal voltage is applied to the differential input of operational amplifier 110 by a capacitive coupling network comprising capacitors 158 and 160. A feedback current that is proportional to the voltage established across resistor 22 passes through battery 24 by means of external feedback path conductors 162 and 164 along with battery contacts 134 and 136.

The ac input signal voltage established across viewing resistor 156 is generated by a precisely-leveled oscillator circuit comprising operational amplifier 112, analog switch 118, and zener diode 166. Operational amplifier 112 along with resistors 168, 170, 172, 174, and capacitor 176 comprise a conventional a stable multivibrator circuit used to generate a square-wave synchronizing signal. Resistor 178 supplies bias current to zener diode 166. The synchronizing output signal of operational amplifier 112 connects to the control input of analog switch 18. The signal terminals of analog switch 118 interconnect the output of zener diode 166 with the input of potentiometer 180. A current proportional to the output voltage of potentiometer 180 passes through injection resistors 182 and 814 and is injected into viewing resistor 156 thereby developing a signal voltage across viewing resistor 156.

Variable resistance 182 and fixed resistance 184 comprise variable attenuator network 34 of FIGS. 3 and 4a. These two resistances correspond, respectively, to resistor R7 and resistor R8 of FIG. 4a. In the case of the embodiment disclosed herein, variable resistance 182 is chosen to have a maximum value of 100K ohms and fixed resistance 184 is chosen as 25K ohms. Equation (5) discloses that these particular choices will permit state-of-charge compensation to be implemented over the range of open-circuit-voltage extending from 11.5 volts to 12.6 volts. The correspondence between the open-circuit-voltage, $V_o$, and the resistance of the 100K variable resistance, 182, as derived from Equation (5), is disclosed in Table I.

TABLE I

| Calibration of Variable Resistance 182 | |
|---|---|
| $V_o$(Volts) | R182 (Ohms) |
| 12.6 | 100K |
| 12.5 | 97.2K |
| 12.4 | 93.2K |
| 12.3 | 87.9K |
| 12.2 | 81.5K |
| 12.1 | 73.8K |
| 12.0 | 64.9K |
| 11.9 | 54.8K |
| 11.8 | 43.5K |
| 11.7 | 31.0K |
| 11.6 | 17.3K |
| 11.5 | 2.3K |

Analog switch 120 along with operational amplifier 114, which is connected as an integrator, comprise 40 of FIG. 3. Resistor 194 and bypass capacitor 196 comprise a low-pass filter which biases the noninverting input of operational amplifier 114 to the voltage level of the dc bias component developed across resistor 22. A signal current derived from the total voltage at the common connection between resistor 22 and transistor 138 passes through resistor 198 and analog switch 120 to the inverting input of operational amplifier 114. This signal current is periodically interrupted at the oscillator frequency by virtue of the control input of analog switch 120 being connected to the output of operational amplifier 112. Resistor 200 provides negative dc feedback operational amplifier 114. Integration capacitor 202 serves to smooth the detected voltage signal outputted by operational amplifier 114.

With function selector switch 128 in the $G_x$ position, the circuit is configured for measuring dynamic conductance. The noninverting input of operational amplifier 116 is biased to the dc level of the noninverting input of operational amplifier 114 and the inverting input of operational amplifier 116 is connected to switch 206. Under these circumstances, a current proportional to the detected signal voltage at the output of operational amplifier 114 passes through milliameter 204 to the output of operational amplifier 116 by way of one of the two paths selected by SPDT switch 206. With switch 206 in position 1, the meter current passes through fixed resistor 208. Under these conditions, the disclosed invention emulates a direct reading battery testing device with quantitative output displayed in battery measuring units that are proportional to the dynamic conductance of battery 24. With switch 206 in position 2, the meter current passes through fixed resistor 210 and variable resistor 212. Under these conditions the disclosed invention emulates a qualitative, "pass-fail", battery testing device having a manually adjusted battery rating scale that is directly related to the setting of variable resistance 212, and a rating offset that is determined by the value of fixed resistor 210.

With function selector switch 128 in the $V_o$ position, the circuit is configured for measuring open-circuit terminal voltage. The noninverting input of operational amplifier 116 is biased to the voltage level established at the common connection of resistors 186 and 188. These resistors, in turn, connect to battery 24 at connection points 134 and 136. The inverting input is connected to the positive battery terminal at 134 through voltage-calibration resistance 126. Kith this arrangement, the current through milliameter 204 is equal to the voltage established across resistance 186 divided by the value of resistance 126. Since the voltage across resistance 186 is directly proportional to the terminal voltage of battery 24, the milliameter can be readily calibrated in open-circuit voltage units.

The improved battery testing device disclosed in FIG. 5 is operated as follows: The operator connects the device to the battery undergoing test and selects "$V_o$" with function selector switch 128. He then reads the measured value of the battery's open-circuit voltage on an appropriate scale on milliameter 204. This measured value of $V_o$ is next entered with variable resistance 182 by utilizing a calibration scale that has been arranged according to Table I. The operator then selects "$G_x$" with function selector switch 128 and observes the display presented by milliameter 204. If switch 206 is in position 1, meter 204 will display the battery's quantitative condition in appropriate battery measuring units—adjusted to comport with that of a fully-charged battery. If switch 206 is in position 2 and variable resistance 212 has been set in accordance with the battery's rating, meter 204 will display the battery's qualitative condition—also adjusted to comport with that of a fully-charged battery.

A list of component types and values for the improved electronic battery testing device disclosed in FIG. 5 is given in Table II.

TABLE II

| Component Types and Values for Circuit of FIG. 5 | |
|---|---|
| REFERENCE NUMBER | COMPONENT |
| Semiconductor Devices | |
| 110, 112, 114, 116 | IC1 - LM324N |
| 118, 120 | IC2 - CD4066B |
| 138 | TIP31C Power Transistor |
| 166 | 1N5231B Zener Diode |
| Resistors - Ohms ($\frac{1}{4}$ - W unless specified) | |
| 22 | 22 - 5 Watts |
| 156 | 39 |
| 210 | 100 |
| 208 | 470 |
| 212 | 500 Variable |
| 142, 144, 178 | 1K |
| 180 | 10K Trimpot |
| 186, 188 | 10K |
| 184 | 25K |
| 140, 200 | 47K |
| 194, 198 | 100K |
| 182 | 100K Variable |
| 172 | 150K |
| 174 | 270K |
| 150, 152, 168, 170 | 1 Meg |
| Capacitors - Mfd | |
| 176 | 0.022 |
| 154, 158, 160, 196 | 0.47 |
| 202 | 1.0 |
| Meter | |
| 204 | 1 mA dc milliameter |
| Switches | |
| 128 | DPDT |
| 206 | SPDT |

Although a specific mode for carrying out the invention hereof has been herein described, it should be understood that many modifications and variations can be made without departing from what is regarded to be the scope and subject matter of the invention.

For example, specific means have been disclosed for measuring the battery's open-circuit voltage and then entering the result on a calibrated attenuator included in the dynamic-conductance amplifier cascade. However, many alternative methods for correcting the measured dynamic conductance in inverse correspondence with the measured open-circuit voltage relative to its fully-charged value will be apparent to those skilled in the art. The correction could, for example, be implemented with a microprocessor. All such variations are believed to be within the scope of this invention.

Furthermore, the means providing an output display to the user has been described as a single dc milliameter in the embodiments disclosed herein. However, it is apparent that separate display means could be used to display the open-circuit voltage and the dynamic conductance test results. Also, the numeric display used for displaying both the open-circuit voltage and the quantitative dynamic conductance result could just as well be provided by a digital meter, a numeric printer, or a computer terminal. Similarly, the qualitative result of a "pass-fail" dynamic conductance test could just as well be displayed by a plurality of LEDs, colored lights, or by an audible sound. Other, equally effective, means for displaying open-circuit voltage measurements and dynamic conductance test results will be apparent to one skilled in the art.

These, and other variations of embodiments are believed to be well within the scope of the present invention and are intended to be covered by the appended claims.

What is claimed is:

1. A process for testing a partially charged electrochemical cell or battery having an open-circuit voltage and a dynamic conductance comprising the steps of:
    a. determining the value of the open-circuit voltage;
    b. generating a signal proportional to the dynamic conductance;
    c. adjusting the signal level in inverse correspondence with the value of the open-circuit voltage relative to a fully-charged value; and,
    d. displaying the adjusted result.

2. A process as in claim 1 wherein the step of determining the value of the open-circuit voltage comprises measuring the open-circuit voltage value, and the step of adjusting the signal level comprises manually entering the measured open-circuit voltage value.

3. A process as in claim 1 wherein the step of displaying the adjusted result comprises displaying a particular one of a plurality of qualitative results selected in accordance with the magnitude of the adjusted signal level.

4. A process as in claim 3 wherein the cell or battery has an electrical rating, including the step of manually adjusting the signal level in accordance with the electrical rating.

5. A process as in claim 1 wherein the step of displaying the adjusted result comprises displaying a numerical result proportional to the magnitude of the adjusted signal level.

6. A process for testing a partially charged electrochemical cell or battery having an open-circuit voltage and a dynamic conductance comprising the steps of:
    a. measuring the open-circuit voltage;
    b. measuring the dynamic conductance;
    c. adjusting the measured dynamic conductance in inverse correspondence with the measured open-circuit voltage relative to a fully-charged value; and,
    d. displaying the adjusted result.

7. A process as in claim 6 wherein the step of adjusting the measured dynamic conductance comprises manually entering the measured open-circuit voltage.

8. A process as in claim 6 wherein the step of displaying the adjusted result comprises displaying a particular one of a plurality of qualitative results selected in accordance with the magnitude of the adjusted dynamic conductance.

9. A process as in claim 8 wherein the cell or battery has an electrical rating, including the step of manually adjusting the measured dynamic conductance in accordance with the electrical rating.

10. A process as in claim 6 wherein the step of displaying the adjusted result comprises displaying a numerical result proportional to the magnitude of the adjusted dynamic conductance.

* * * * *

UNITED STATES PATENT AND TRADEMARK OFFICE
CERTIFICATE OF CORRECTION

PATENT NO. : 4,912,416

DATED : March 27, 1990

INVENTOR(S) : Keith S. Champlin

It is certified that error appears in the above-identified patent and that said Letters Patent is hereby corrected as shown below:

On the title page, item [57]:

In the abstract, lines 7-8, delete the word "conduction" and substitute therefor --condition--.

Column 2, line 57, delete the word "incorporated" and substitute therefor --incorporates--.

Column 2, line 62, delete the word "emulated" and substitute therefor --emulates--.

Column 3, line 2, delete the words "device of" and substitute therefor --device or--.

Column 3, lines 4-5, delete the word "discloses" and substitute therefor --disclosed--.

Column 3, line 40, delete the word "of" and substitute therefor --on--.

Column 4, line 1, delete the word "electronics" and substitute therefor --electronic--.

UNITED STATES PATENT AND TRADEMARK OFFICE
CERTIFICATE OF CORRECTION

PATENT NO. : 4,912,416

DATED : March 27, 1990

INVENTOR(S) : Keith S. Champlin

It is certified that error appears in the above-identified patent and that said Letters Patent is hereby corrected as shown below:

Column 4, line 57, the title "DETAILED DESCRIPTION" should be on a separate line.

Column 5, line 13, delete the word "is" and substitute therefor --its--.

Column 5, line 26, delete the word "is" and substitute therefor --its--.

Column 7, line 52, delete the word "man," and substitute therefor --may,--.

Column 8, line 45, the word "cascade" should be inserted after the word "amplifier".

Column 10, line 48, delete the words "a stable" and substitute therefor --astable--.

UNITED STATES PATENT AND TRADEMARK OFFICE
CERTIFICATE OF CORRECTION

PATENT NO. : 4,912,416

DATED : March 27, 1990

INVENTOR(S) : Keith S. Champlin

It is certified that error appears in the above-identified patent and that said Letters Patent is hereby corrected as shown below:

Column 10, line 57, delete the number "814" and substitute therefor --184--.

Signed and Sealed this

Seventeenth Day of September, 1991

*Attest:*

HARRY F. MANBECK, JR.

*Attesting Officer*  *Commissioner of Patents and Trademarks*